(12) United States Patent
Miller et al.

(10) Patent No.: US 6,200,389 B1
(45) Date of Patent: *Mar. 13, 2001

(54) SINGLE BODY INJECTOR AND DEPOSITION CHAMBER

(75) Inventors: Adam Q. Miller, Felton; Daniel M. Dobkin, Sunnyvale, both of CA (US)

(73) Assignee: Silicon Valley Group Thermal Systems LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/113,823

(22) Filed: Jul. 10, 1998

Related U.S. Application Data

(63) Continuation-in-part of application No. 08/892,469, filed on Jul. 14, 1997, now Pat. No. 6,022,414, which is a continuation-in-part of application No. 08/621,772, filed on Mar. 22, 1996, now Pat. No. 5,683,516, which is a continuation of application No. 08/276,815, filed on Jul. 18, 1994, now abandoned.

(51) Int. Cl.[7] .................................................. C23C 16/00
(52) U.S. Cl. .................... 118/729; 118/715; 118/718; 118/724; 118/725; 156/345
(58) Field of Search ..................... 118/715, 718, 118/725, 724, 729; 156/345

(56) References Cited

U.S. PATENT DOCUMENTS

| 3,674,453 | 7/1972 | Loukes et al. | 65/30 |
| 4,123,244 | 10/1978 | Leclercq et al. | 65/60 C |

(List continued on next page.)

FOREIGN PATENT DOCUMENTS

| 107 723 | 12/1973 | (DE) | C23C/13/08 |
| 322466A1 | 7/1989 | (EP) | . |
| 605725A1 | 7/1994 | (EP) | . |
| 2 004 851 | 8/1978 | (GB) | . |

OTHER PUBLICATIONS

Willard, Hobart H., et al., *Instrumental Methods of Analysis*, Fifth Ed. (1974), pp. 352–353.

*Primary Examiner*—Jeffrie R. Lund
(74) *Attorney, Agent, or Firm*—Flehr Hohbach Test Albritton & Herbert LLP

(57) ABSTRACT

A deposition chamber for delivering gases to a substrate or wafer for processing of said substrate or wafer is provided. The injector is provided comprising an elongated member with end surfaces and at least one gas delivery surface extending along the length of the member and which includes a number of first elongated passages formed therein for received a gas. Also formed within the member are a number of thin distribution channels which extend between the first elongated passages and the gas delivery surface. In another embodiment, the injector further includes at least one second elongated passage formed therein for receiving an etchant species. Metering tubes may be inserted into each elongated passage and are spaced from the walls of said passages and extend between the ends. The deposition chamber includes at least one injector as described above; a plurality of vent blocks having end surfaces and at least one elongated external surface extending along the length of each of the vent blocks; and a support positioned beneath the injector and vent blocks, creating a deposition region there between. The vent blocks are positioned adjacent one on each side of the injector, and spaced from the injector to define exhaust channels there between for removing the gas.

15 Claims, 12 Drawing Sheets

U.S. PATENT DOCUMENTS

| | | | |
|---|---|---|---|
| 4,131,659 | 12/1978 | Authier et al. | 264/25 |
| 4,136,828 | 1/1979 | Anderson et al. | 239/422 |
| 4,293,326 | 10/1981 | Ternen et al. | 65/60 D |
| 4,369,031 | 1/1983 | Goldman et al. | 432/198 |
| 4,446,815 | 5/1984 | Kalbskopf et al. | 118/718 |
| 4,469,045 | 9/1984 | Chesworth | 118/718 |
| 4,499,853 | 2/1985 | Miller | 118/725 |
| 4,537,795 | 8/1985 | Nath et al. | 427/39 |
| 4,756,272 | 7/1988 | Kessler et al. | 118/715 |
| 4,787,813 | 11/1988 | Stevens et al. | 414/744.5 |
| 4,834,020 | 5/1989 | Bartholomew et al. | 118/719 |
| 4,845,054 | 7/1989 | Mitchener | 437/238 |
| 4,891,247 | 1/1990 | Shamshoian | 427/255.3 |
| 4,986,216 | 1/1991 | Ohmori et al. | 118/730 |
| 5,041,150 * | 8/1991 | Grundy et al. | 65/60.51 |
| 5,088,773 | 2/1992 | Gralenski | 285/52 |
| 5,113,789 | 5/1992 | Kamian | 118/715 |
| 5,122,391 | 6/1992 | Mayer | 427/126.3 |
| 5,136,975 | 8/1992 | Bartholomew et al. | 118/715 |
| 5,221,556 | 6/1993 | Hawkins et al. | 427/255 |
| 5,232,508 | 8/1993 | Arena et al. | 118/719 |
| 5,269,847 | 12/1993 | Anderson et al. | 118/715 |
| 5,328,722 | 7/1994 | Ghanayem et al. | 427/250 |
| 5,336,326 | 8/1994 | Karner et al. | 118/723 HC |
| 5,377,300 | 12/1994 | Collins et al. | 392/479 |
| 5,391,232 | 2/1995 | Kanai et al. | 118/715 |
| 5,393,563 * | 2/1995 | Ellis | 427/248.1 |
| 5,411,590 | 5/1995 | Hawkins et al. | 118/715 |
| 5,453,124 | 9/1995 | Moslehi et al. | 118/715 |
| 5,456,740 | 10/1995 | Snow et al. | 96/11 |
| 5,487,784 | 1/1996 | Ellis, Jr. | 118/718 |
| 5,628,828 | 5/1997 | Kawamura et al. | 118/719 |
| 5,653,808 | 8/1997 | MacLeish et al. | 118/715 |
| 5,683,516 | 11/1997 | DeDontney et al. | 118/718 |
| 5,704,982 * | 1/1998 | Oudard et al. | 118/718 |
| 5,707,451 | 1/1998 | Robles et al. | 118/715 |
| 5,709,726 * | 1/1998 | Terneu et al. | 65/157 |
| 5,728,224 * | 3/1998 | Laurent et al. | 118/718 |
| 5,935,647 * | 8/1999 | Dedontney et al. | 427/248.1 |
| 6,022,414 * | 2/2000 | Miller et al. | 118/718 |

* cited by examiner

SINGLE BODY INJECTOR AND DEPOSITION CHAMBER

CROSS-REFERENCE TO RELATED APPLICATION

This application is a continuation-in-part of application Ser. No. 08/892,469 filed Jul. 14, 1997; now U.S. Pat. No. 6,022,414; which is a continuation-in-part of application Ser. No. 08/621,772 filed Mar. 22, 1996, now U.S. Pat. No. 5,683,516 issued Nov. 4, 1997 which is a File Wrapper Continuing application of Ser. No. 08/276,815 filed Jul. 18, 1994 (now abandoned), the disclosures of which are herein incorporated by reference. U.S. patent application Ser. No. 09/113,730, filed simultaneously herewith is incorporated herein in its entirety by reference.

BRIEF DESCRIPTION OF THE INVENTION

The present invention relates to an injector for delivering gases to a surface and to a deposition chamber for processing a substrate. More particularly, the invention relates to a single body injector and to a deposition chamber having an integrated single body injector for processing a semiconductor substrate by chemical vapor deposition (CVD). The invention also relates to a method of fabricating a single body injector and deposition chamber.

BACKGROUND OF THE INVENTION

Chemical vapor deposition (CVD) is a critical component in semiconductor manufacturing. CVD occurs when a stable compound is formed by a thermal reaction or decomposition of certain gaseous chemicals and such compounds are deposited on a surface of a substrate. CVD systems come in many forms. One apparatus for such a process comprises a conveyorized atmospheric pressure CVD (APCVD) system which is described in U.S. Pat. No. 04,834,020 and is owned by assignee. This patent is incorporated herein by reference. Other CVD apparatus may be used such as plasma-enhanced CVD (PECVD) systems, and low pressure CVD (LPCVD) systems.

Important components of a CVD system include the deposition chamber where deposition occurs, and the injector utilized for delivering gaseous chemicals to the surface of the substrate. The gases must be distributed over the substrate, so that the gases react and deposit an acceptable film at the surface of the substrate. The deposition chamber must be carefully designed to provide a controlled environment in which deposition can take place. For example, the chamber must provide gas confinement, but reduce recirculation of the gases which can cause pre reaction of the gases and the deposition of a non-uniform film. The chamber must provide exhausting for the elimination of excess reactants and reaction by-products, yet not disrupt the flow of gases to the substrate for reaction. Moreover, the temperature of the chamber and its components must be carefully controlled to avoid condensation of reactant gases, minimize accumulation of byproduct dust and enable cleaning of the system. Additionally, the deposition chamber should preferably maintain mechanical integrity (such as tolerances) throughout its operation. All of these factors must be carefully balanced to provide a proper environment for deposition.

A function of the injector in such a deposition chamber is to distribute the gases to a desired location in a controlled manner. Controlled distribution of the gases maximizes the chance of complete, efficient and homogeneous reaction of the gases, in part by minimizing pre-mixing and prior reaction of the gases. A complete reaction provides a greater opportunity for a good quality film. If the gas flow is uncontrolled, the chemical reaction will not be optimal and the result will likely be a film which is not of uniform composition. When the film is not of uniform composition, the proper functioning of the semiconductor is impaired. Thus it is important that an injector design facilitates the desired flow of the gases in a controlled manner.

In a prior art injector, owned by the assignee and described in U.S. Pat. No. 5,136,975, a number of stacked plates each including a number of linear hole arrays is utilized. The plates produce a number of cascaded hole arrays and a chute surrounded by a cooling plate is positioned beneath the last hole array. The chute includes a central passage and ducts are formed between the chute and the cooling plate. Chemical lines deliver gases to a top plate which discretely conveys the gases to the top of individual cascaded hole arrays. The gases are fed through cascaded hole arrays which cause the gas to flow in an increasingly uniform manner. The chute passage receives the gases individually and then conveys the gases to a region above a wafer. In this region, the gases mix, react and then form a film or layer on the wafer.

The cascading action described above provides an uniformly distributed gas flow. However, flow control and simplicity of injector design can be improved. Further, the integration of the injector into the deposition chamber can be considered. Often, in prior art systems the injector is inserted into the deposition chamber, and sealed with a separate frame. The exhaust and purge arrangement, and temperature control systems add further mechanical components to the chamber. All of these components introduce mechanical complexity into the design. Additionally, the requirement for seals to mate all of these components makes temperature control of the component surfaces more difficult, and increase maintenance costs and downtime of the system due to their deterioration from exposure to eroding environments. Thus it is desirable to provide a deposition chamber that minimizes the aforementioned problems.

OBJECTS AND SUMMARY OF THE INVENTION

It is an object of this invention to provide an improved deposition chamber for processing of semiconductor substrates.

It is a further object of this invention to provide an improved injector for delivering gaseous chemicals in a controlled manner to a surface for depositing films or layers on the surface by chemical vapor deposition (CVD).

It is additionally an object of the present invention to provide a deposition chamber having an integrated injector.

Another object of this invention is to provide an injector fabricated from a single block of material, thereby eliminating complicated machined parts requiring precision alignment and positioning.

A further object of this invention is to provide an injector free from internal seals, thereby minimizing maintenance and associated costs.

Another object of the present invention is to provide a deposition chamber that minimizes the number of components and seals thereby reducing maintenance and downtime costs.

A further object of the present invention is to provide an injector and exhaust system in which the temperature of all surfaces exposed to the reacting gases may be accurately controlled.

A related object of this invention is to provide a deposition chamber and injector which improves the uniformity of films deposited on wafers.

These and other objects are achieved by the injector herein disclosed comprising an elongated member with end surfaces and at least one gas delivery surface extending along the length of the member and which includes a number of elongated passages formed therein. Also formed within the member are a number of thin distribution channels which extend between the elongated passages and the gas delivery surface. In another embodiment of the invention a number of metering tubes may be inserted into each elongated passage and are spaced from the walls of said passages and extend between the ends. The metering tubes may contain openings of varying form and dimension which may be directed away from the distribution channels. The metering tubes receive a gaseous chemical which is conveyed along the metering tubes, whereby the gas flows out of the openings, and is conveyed through the corresponding distribution channel and is directed in a substantially controlled manner along the length of the gas delivery surface. In the instance where a number of gases are employed, the distribution channels direct the distribution of such gases to a region where mixing of the gases is desired. In addition the distribution channels prevent chemical fouling of the injector by preventing premature chemical reaction of the gases. The gases are directed to a desired region where they mix, react and form a uniform thin film on the substrate positioned beneath the injector.

In an alternative embodiment an injector is provided which further contains an elongated passage for receiving an etchant species. The etchant species is conveyed to the gas delivery surface via at least one distribution channel which extends between the elongated passage and the gas delivery surface. The etchant species is distributed along the gas delivery surface where it removes deposited materials along the gas delivery surface and other surfaces within the chamber.

In another alternative embodiment an injector is provided comprising an elongated member with end surfaces and at least one gas delivery surface extending along the length of the member and which includes a number of first elongated passages formed therein for received a gas. The gas delivery surface contains rounded side regions and a center recessed region. Also formed within the member are a number of thin distribution channels which extend between the first elongated passages and the center recessed region of the gas delivery surface. In another embodiment, the injector further includes at least one second elongated passage formed therein for receiving an etchant species. The etchant species is conveyed via at least one thin distribution channel which extends between the second elongated passage and one of the rounded side regions of the gas delivery surface. As described above, metering tubes may be inserted into each elongated passage and are spaced from the walls of said passages and extend between the ends.

NEW EMBODIMENT

Of particular advantage, the invention further provides for an inventive deposition chamber. The deposition chamber includes an injector comprised of a single member having end surfaces and at least one elongated gas delivery surface extending along the length of the injector for delivering gases to the substrate; a plurality of vent blocks having end surfaces and at least one elongated external surface extending along the length of each of the vent blocks; and a support positioned beneath the injector and vent blocks, creating a deposition region therebetween. The vent blocks are positioned adjacent one on each side of the injector, and spaced from the injector to define exhaust channels therebetween for removing the gas.

In an alternative embodiment, a deposition chamber is provided that is comprised of multiple injectors and vent blocks

BRIEF DESCRIPTION OF THE DRAWINGS

Other objects and advantages of the invention become apparent upon reading of the detailed description of the invention provided below and upon reference to the drawings, in which.

DETAILED DESCRIPTION OF THE INVETION

Figure 1:
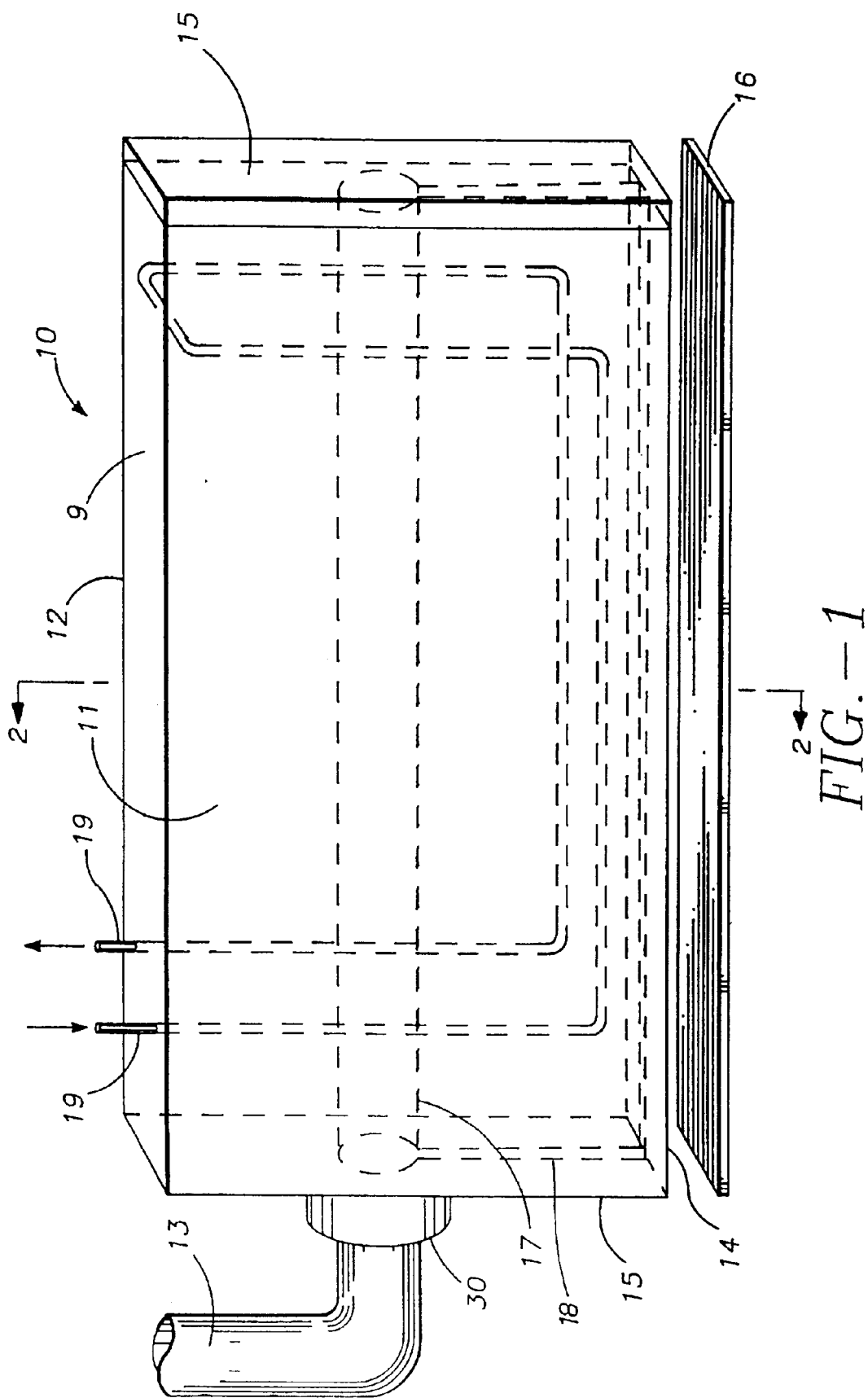
FIG. 1 is a side elevated view of an injector in accordance with one embodiment of the present invention.
Figure 2:
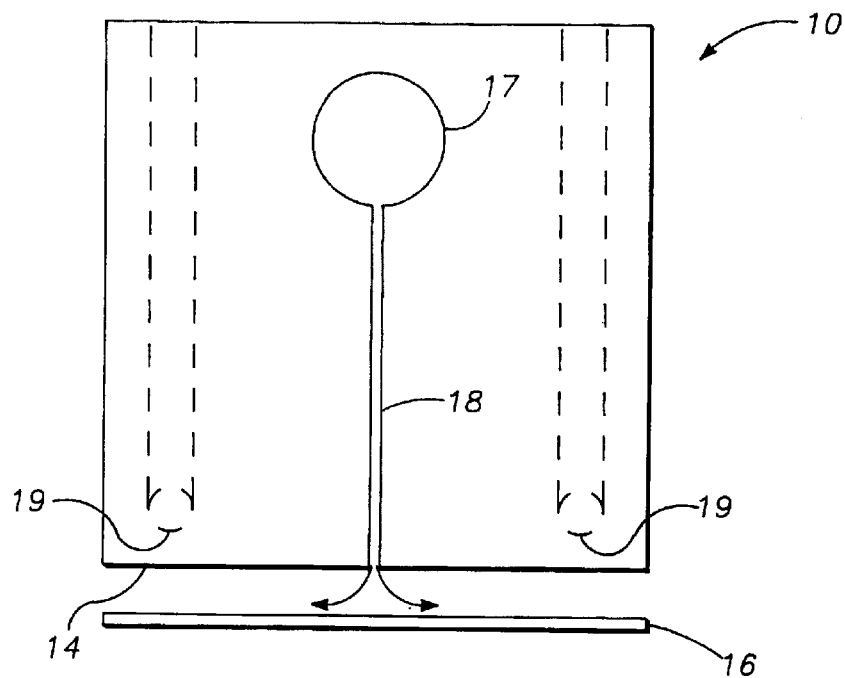
FIG. 2 is a cross-sectional view taken along the line 2—2 of FIG. 1. of one embodiment of the injector.

Turning to the drawings, wherein like components are designated by like reference numerals in the figures, FIGS. 1 and 2 represent one embodiment of the injector ofthe present invention. The injector 10 comprises a member or block which includes front 11, back 12, top 9, bottom 14 and end 15 surfaces. In this embodiment of the invention, the bottom surface 14 is the gas delivery surface. Positioned beneath injector 10 is a substrate 16.

The injector 10 includes a first elongated passage 17 formed in the injector 10 and extending between the end surfaces 15. One end surface 15 is closed. Chemical delivery line 13 leads to the end of the elongated passage 17. Additionally, formed in the injector 10 is a distribution channel 18 which extends between the elongated passage 17 and the gas delivery surfuae 14. A view along the length of the injector would show that the distribution channel 18 extends across the substrate 16. In this embodiment a second elongated passage 19 is formed within the injector 10, for circulation of a liquid or gas to control the temperature of the injector 10.

In a CVD process the gas which contains the elements to be deposited are introduced via chemical line 13 and flow along the passage 17 and from this passage 17 to the gas delivery surface 14 along the thin distribution channel 18. The gas flows out of the distribution channel 18 and exits the injector 10 along the length of the gas delivery surface 14, whereby the gas is delivered to a substrate as indicated generally by the arrows in FIG. 2. The gas is distributed by the injector in a substantially controlled linear manner. Although the member 10 has been described as a rectangular block, it can take any shape. The gas delivery surface 14 can be configured to enhance the distribution of the gas.

Figure 3:
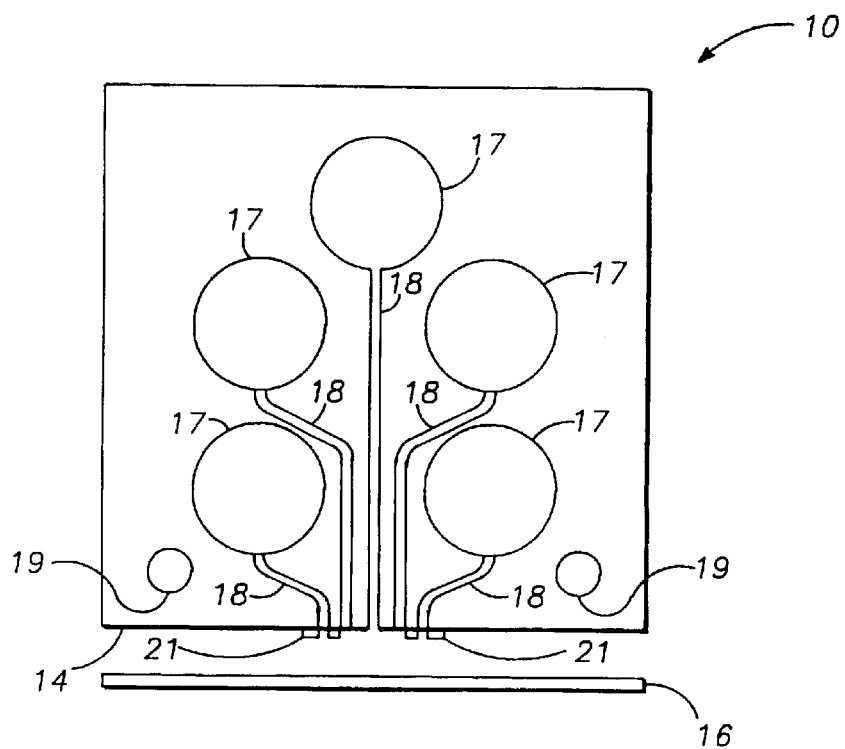
FIG. 3 is a cross-sectional view of an injector in accordance with a second embodiment of the invention.

In many applications a number of gases must be reacted to deposit a proper composition of a film or layer on an substrate. In such instances a plurality of passages is provided, as shown in FIG. 3, a second embodiment of the present invention. Injector 10 contains a plurality of first elongated passages 17, each extending between the end surfaces 15. A chemical delivery line 13 is attached to each passage 17. A plurality of distribution channels 18 are formed in the injector 10 and are spaced apart from one another. Each distribution channel 18 extends between a separate first elongated passage 17 and the gas delivery surface 14. Gases enter the passages 17 and are conveyed though the distribution channels 18 to the gas delivery surface 14, where such gases mix along the length and provide a film or layer upon the substrate 16. To enhance distribution of the gases, the distribution channels 18 direct the flow of the gases to a desired region adjacent to the substrate 16, as the gases exit along the gas delivery surface 14. Additionally, the distribution channels 18 prevent chemical fouling of the injector 10 by directing the gases away from the gas delivery surface thereby preventing premature reaction of the chemicals at such surface. Thus, the gases are individually distributed in a substantially linear flow manner to a desired region where the gases have an opportunity to mix, react and deposit a film or layer on substrate 16. Temperature control of the injector 10 may be accomplished by elongated passages 19.

In this embodiment, a locator ridge 21, for locating the injector 10 in the CVD chamber, is provided which extends perpendicular from the gas delivery surface 14 and along the length of the surface 14, positioned outside the distribution channels 18. Although the locator ridge 21 has been described as extending from the gas delivery surface 14, it can be placed at other surfaces of the member 10.

Figure 4:
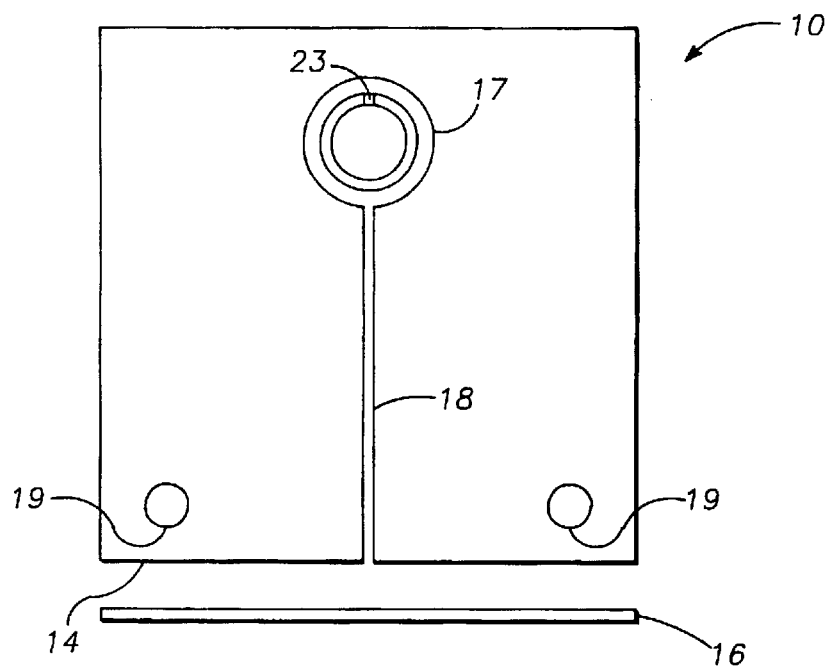
FIG. 4 is a cross-sectional view of an injector in accordance with a third embodiment of the invention.

In CVD applications it is desirable to maintain controlled flow and concentration of the gas introduced into the process. A metering tube 22 can be provided to maintain controlled flow and concentration. The metering tube 22 can also provide for control of the gas flow profile. In some instances it is desirable to provide a specified gas flow profile to compensate for variables in the CVD reaction area which can cause incomplete reaction of the gases and films which are not uniform in composition. For example, it may be desirable to direct a greater volume of gas to a particular area of the substrate 16. The third embodiment of the present invention illustrated in FIG. 4 provides a metering tube 22 containing an opening 23, inserted into the first elongated passage 17. The metering tube 22 is spaced from the walls of the passage 17, and extends between the end surfaces 15. A distribution channel 18 is formed within injector 10, and extends between the elongated passage 17 and the gas delivery surface 14. In one variation of this embodiment, the metering tube 22 includes openings 23, as depicted in FIG. 4. In another variation of this embodiment, the metering tube 22 is made from a porous material and openings are not included in the metering tube 22.

The metering tube 22 receives a gas from chemical line 13 and distributes the gas along the elongated passage 17, where the gas then flows through the distribution channel 18 to the gas delivery surface 14 and out to the substrate 16.

Figure 5:
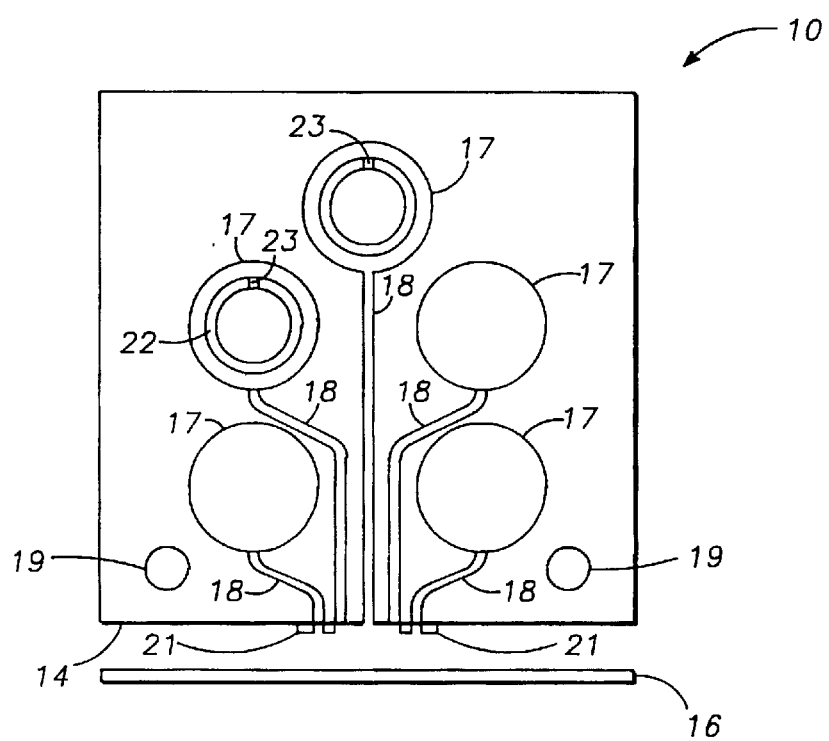
FIG. 5 is a cross-sectional view of an injector in accordance with a fourth embodiment of this invention.

FIG. 5 illustrates a fourth embodiment of the present invention. A plurality of first elongated passages 17 are formed within injector 10, each extending between the end surfaces 15. A plurality of distribution channels 18 are formed in the injector 10 and the distribution channels 18 are spaced apart from one another. Each distribution channel 18 extends between a separate first elongated passage 17 and the gas delivery surface 14. At least one metering tube 22 containing an opening 23, is inserted into at least one of the first elongated passages 17. The metering tube 22 is spaced from the walls of the passage 17, and extends between the end surfaces 15. In a variation of this embodiment, a separate metering tube 22 may be inserted into each of the plurality of first elongated passages 17 provided. A chemical delivery line 13 is attached to each metering tube 22.

Referring again to FIG. 5, a locator ridge 21, for locating the injector 10 in the CVD chamber, is provided which extends perpendicular from the gas delivery surface 14 and along the length of the gas delivery surface 14, positioned outside the distribution channels 18. Temperature control may be accomplished by second elongated passages 19. Locator ridge 21 provides the mechanism for locating the injector 10 within the CVD chamber.

Thus, in the fourth embodiment, chemical delivery lines 13 are attached to corresponding metering tubes 22, or to a combination of metering tubes 22 and first elongated passages 17, and convey gaseous chemicals thereto. The gases pass through the metering tubes 22 and into the surrounding first elongated passages 17, and are conveyed through the corresponding distribution channels 18 to the gas delivery surface 14 along the length of the surface. The distribution channels 18 enhance distribution of the gases by individually directing the flow of the gases to a desired region adjacent to the substrate 16. The metering tubes 22 may be used to adjust the flow profile of one particular gas, or a number of gases to deliver gases of varying concentration at desired regions adjacent to the substrate, thereby controlling the chemical reaction rate occurring within the CVD chamber. By controlling the chemical reaction rate a more uniform film can be deposited on the substrate 16.

In order to adjust the gas flow pattern, many variations may be made in the metering tubes 22. Where a metering tube comprises openings 23, such openings may be directed away from the distribution channel 18. Alternatively, the openings 23 may be directed toward the distribution channel 18. In the preferred embodiment, the openings are opposite the distribution channel. The various configurations of metering tubes 22 are more fully appreciated with reference to FIGS. 6 through 10.

Figure 6:
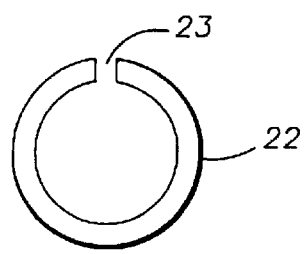
FIG. 6 is a cross-sectional view of the metering tube of the injector illustrated in FIGS. 4 and 5.

FIG. 6 depicts a cross-sectional view of metering tube 22 including an opening 23. Gas is conveyed through the metering tube and is outputted through opening 23. The configuration of opening 23 controls the gas outlet flow profile.

Figure 7:
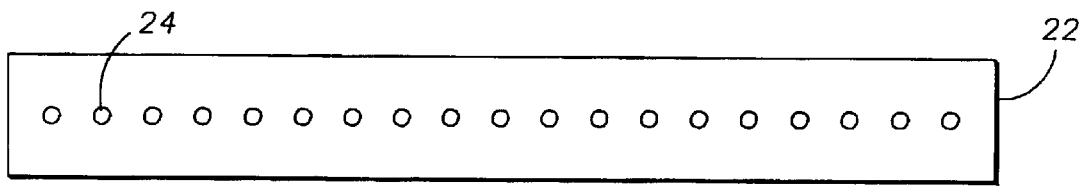
FIG. 7 illustrates a top plan view of one embodiment of an opening pattern in the metering tube of the injector shown in FIGS. 4, 5 and 6.

FIGS. 7 through 10 show the various opening configurations contemplated by the invention to provide adjustment to a desired gas flow pattern. Referring to FIG. 7, the openings 23 comprise a plurality of in-line holes 24 extending along the length of the metering tube 22. In this embodiment, the holes 24 are of equal diameter and equal spacing along the tube 22.

Figure 8:
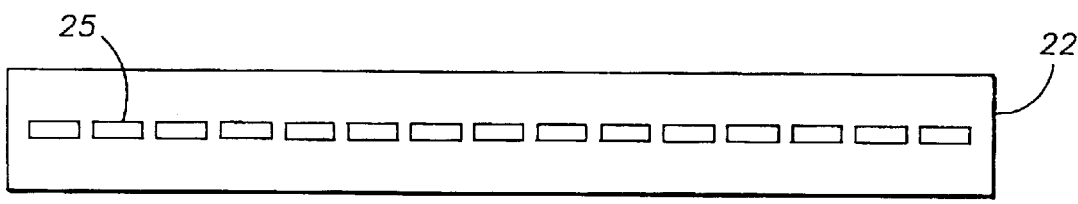
FIG. 8 is a top plan view of an alternative opening pattern in the metering tube of the injector shown in FIGS. 4, 5 and 6.

An alternative opening pattern is shown in FIG. 8, where the openings 23 comprise a plurality of in-line slots 25 extending along the length of the metering tube 22. The slots are of equal dimension and spacing along the tube 22.

Figure 9:
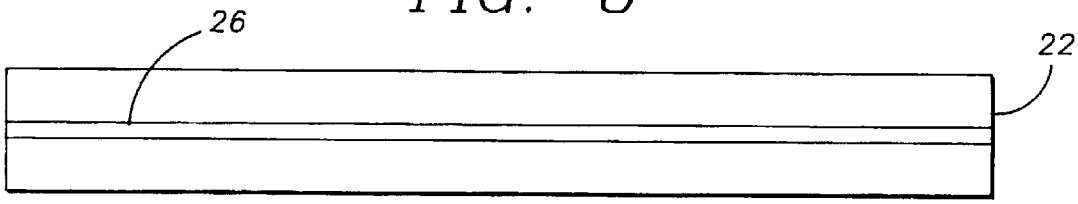
FIG. 9 illustrates a top plan view of a slotted opening in the metering tube of the injector shown in FIGS. 4, 5, and 6.

A further alternative opening pattern is depicted in FIG. 9, where a continuous slot 26 extends along the length of the metering tube 22.

Figure 10:
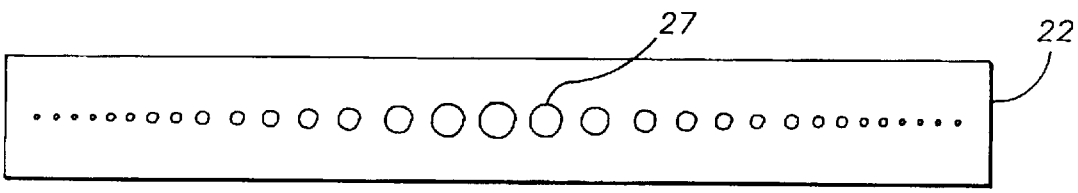
FIG. 10 is a top plan view of another alternative opening pattern in the metering tube of the injector shown in FIGS. 4, 5 and 6.

A still further alternative opening configuration is illustrated in FIG. 10. The openings 27 comprise a plurality of openings which vary in dimension, or pitch or a combination of both, along the length of the metering tube 22. The openings may be holes or slots. In one, the openings begin at a small dimension at each end of the metering tube 22, and gradually increase in dimension toward the center of the metering tube 22. The gas volume flow rate will be greater from the larger openings and thus the gas outlet flow pattern can be controlled.

Figure 11:
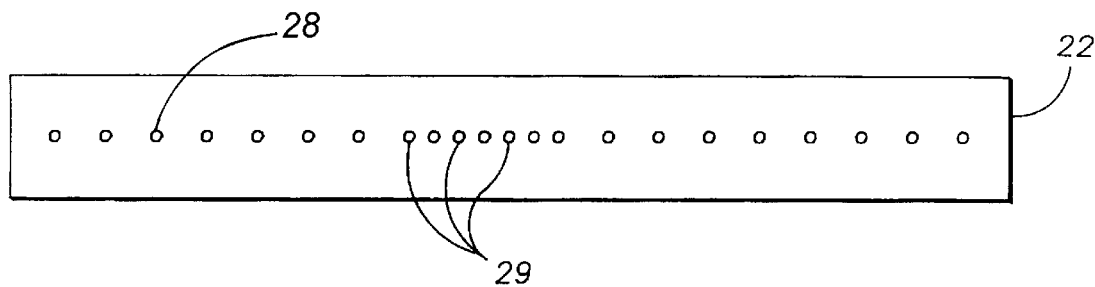
FIG. 11 is a top plan view of yet another alternative opening pattern in the metering tube of the injector shown in FIGS. 4, 5 and 6.

A yet further alternative opening configuration is shown in FIG. 11. The openings 28 comprise a plurality of openings which are the same dimension and pitch along the length of the metering tube 22. Near the center of the metering tube 22, additional openings 29 are provided, such that the volume flow rate will be greater from the center of the metering tube 22.

Figure 12:
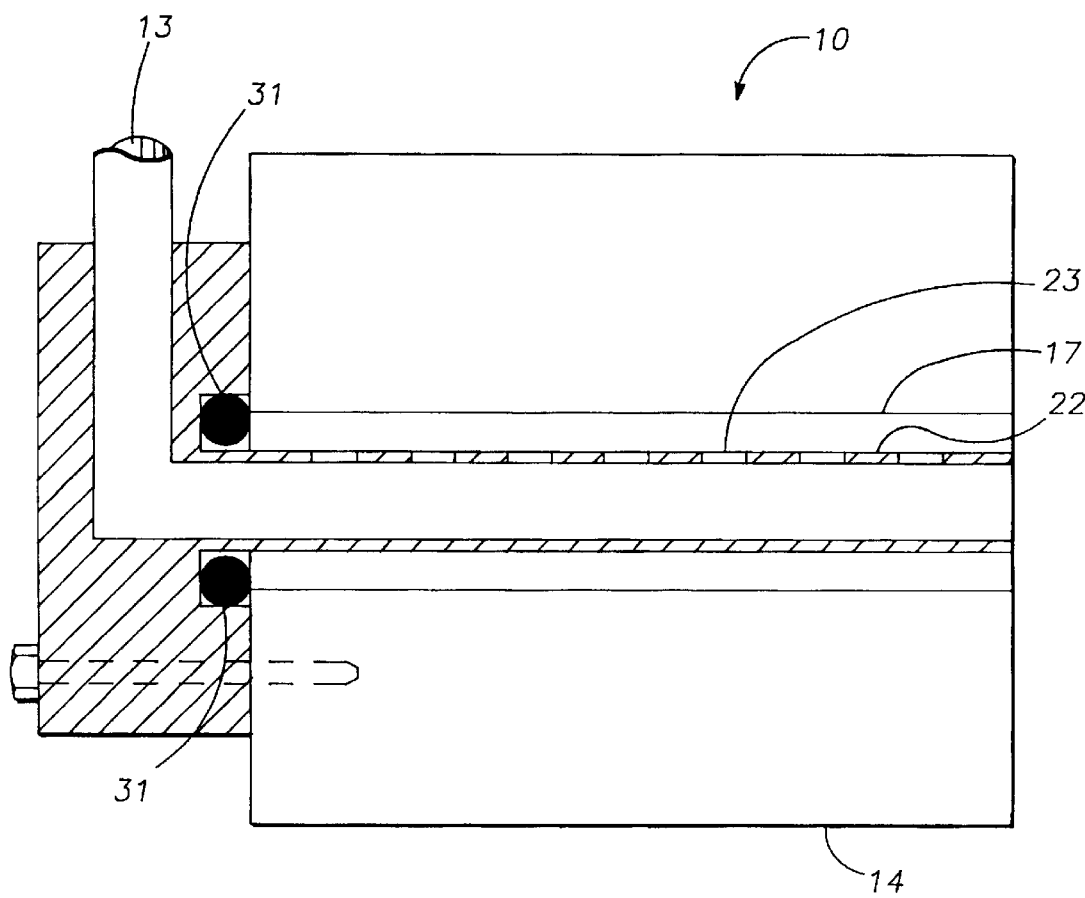
FIG. 12 illustrates an enlarged partial side view of the flange and metering tube attachment to the injector.

Finally, the attachment mechanism between the metering tube 22 and the chemical delivery lines 13 is more fully appreciated by reference to FIG. 12 which shows an enlarged partial side view of an attachment mechanism and metering tube of the injector. A metering tube 22 is inserted into a first elongated passage 17 and extends between the end surfaces 15. A flange 30 is attached to the chemical delivery line 13 and the flange is then attached to the end 15 of the injector 10. A seal 31 is provided therebetween. The metering tube 22 is attached to the flange and provides for an air-tight seal.

Many variations of chemicals are used in CVD processes. The invention provides for various chemical delivery lines. In one embodiment the chemical delivery lines 13 may convey a combination of tetraethoxysilane (TEOS) and nitrogen in one line, nitrogen in a second line and ozone mixed with oxygen in a third line to form a layer of silicon dioxide.

As the foregoing illustrates, there are many variations possible for practicing the invention. The preferred embodiment comprises five first elongated passages, with five metering tubes inserted therein. The dimensions may vary, however in this preferred embodiment each passage is approximately ⅜ inches in diameter, and the outer diameter of each metering tube is approximately ¼ inch diameter. The metering tube contains fifty equally spaced holes of equal dimension along the length of the metering tube.

Various manufacturing techniques known in the art can be used to form the distribution channels 18. In the preferred embodiment the distribution channels are formed by a wire electrode discharge machine (EDM).

Figure 13:
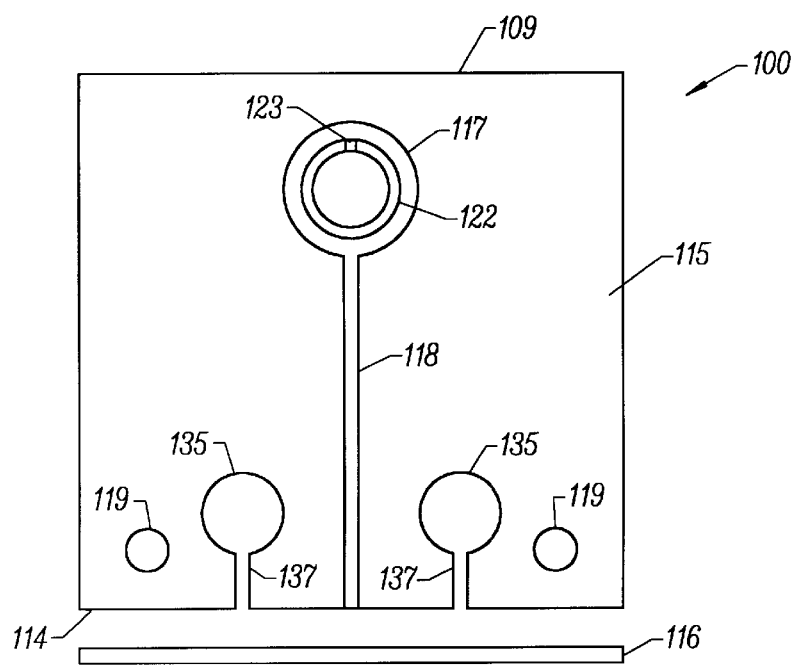
FIG. 13 is a cross-sectional view of an injector in accordance with an alternative embodiment of the invention which employs passages for delivering an etchant species.

In an alternative embodiment of the invention, at least one additional passage is provided for conveying an etchant species to the gas delivery surface and out to the area adjacent the wafer. Of particular advantage, the etchant species serves to remove any reaction deposits that build up on the surfaces of the injector and other regions around the injector which accumulate during processing of the wafer. Turning to FIG. 13 the embodiment is shown where, an injector 100 is provided comprised of a single member and having front, back (not shown), top 109, and end 115 surfaces, and a bottom gas delivery surface 114. A substrate 116 is positioned below the injector 100.

The injector 100 also includes a first elongated passage 117 formed in the injector 100 and extending between the end surfaces 115. Additionally, formed in the injector 100 is a distribution channel 118 which extends between the elongated passage 117 and the gas delivery surface 114. A view along the length of the injector would show that the distribution channel 118 extends across the substrate 116. As described above, as gas flows into passage 117 from chemical delivery lines, the gas flows along the passage 117 to the gas delivery surface 114 along the thin distribution channel 118. The gas flows out of the distribution channel 118 and exits the injector 100 along the length of the gas delivery surface 114, whereby the gas is delivered to a substrate in a substantially controlled manner. Another elongated passage 119 formed within the injector 100 may be provided for circulation of a liquid or gas to control the temperature of the injector 100. As described above, a metering tube 22 with opening 123 inserted into elongated passage 117 may also be provided.

During the deposition process, reactants and reaction by-products tend to accumulate on the external surfaces of the injector, as well as on other surfaces within the CVD system. As such deposits build, they can foul the operation of the injector and are the source of contaminants which end up in the deposited film. Of particular advantage, this embodiment of the present invention introduces an etchant species for removal of such deposits. Specifically, at least one elongated passage 135 is formed within the injector 100 and extends between the end surfaces 115. Distribution slot 137 is also formed within the injector 100 and extends between the elongated passage 135 to the gas delivery surface 114. While the exemplary embodiment shows two passages 135, it is to be understood that one or a number of passages 135 may be used. Elongated passage 135 serves to receive an etchant species, such as hydrofluoric acid (HF) and the like. The etchant species flows into passage 135 and through the distribution slot 137, where it is conveyed to the gas delivery surface 114. The etchant species contacts the gas delivery surface 114 and acts to etch away and remove deposits that have accumulated along the surface 114. For this cleaning process it is important that the temperature of the surfaces of the injector be well controlled. To achieve good temperature control of the surfaces, cooling passages 119 are employed and coolant is circulated therethrough during the claims process. Preferably, the etchant species is introduced before or after the deposition process has taken place. Alternatively, the etchant species may be conveyed during the deposition process to minimize the accumulation of deposits.

Figure 14:
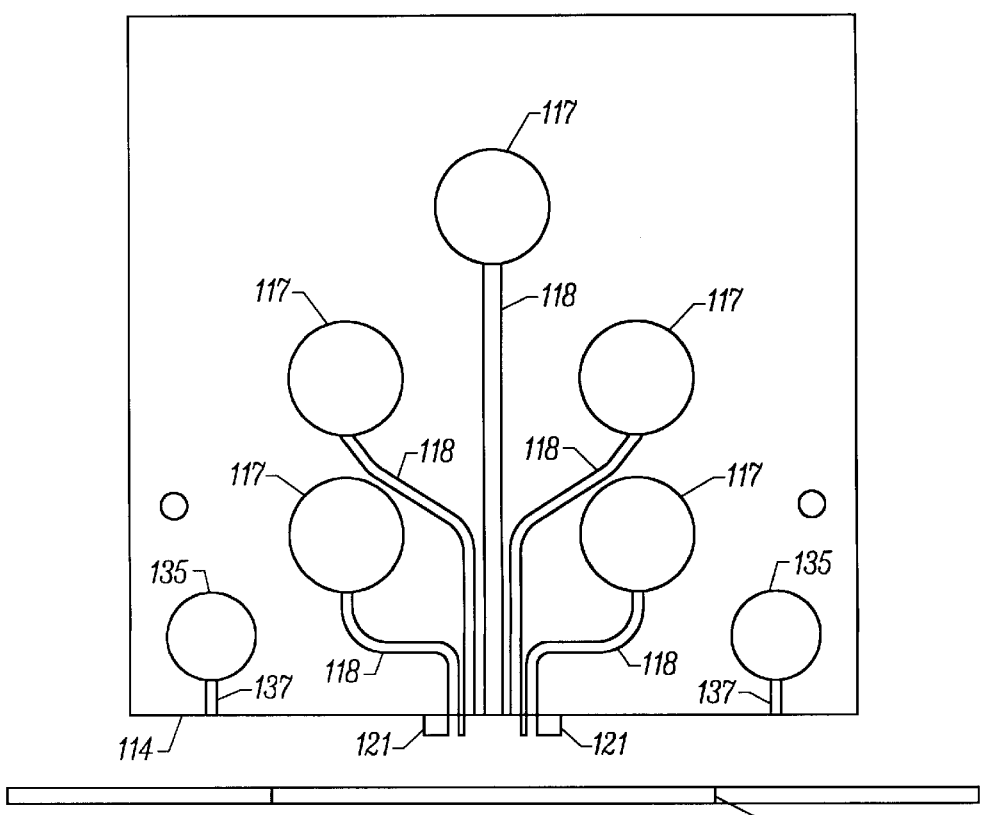
FIG. 14 is a cross-sectional view of an injector in accordance with another embodiment of the injector shown in FIG. 13.

FIG. 14 illustrates an alternative embodiment of the invention where a plurality of elongated passages 117 are used to deliver a plurality of gases. Elongated passages 135 and distribution slots 137 deliver an etchant species to the gas delivery surface 114 having a loacator ridge 121. Again, as described above, a metering tube may be inserted into one or more of the elongated passages 117 for controlling the distribution profile of the gases.

Figure 15A:
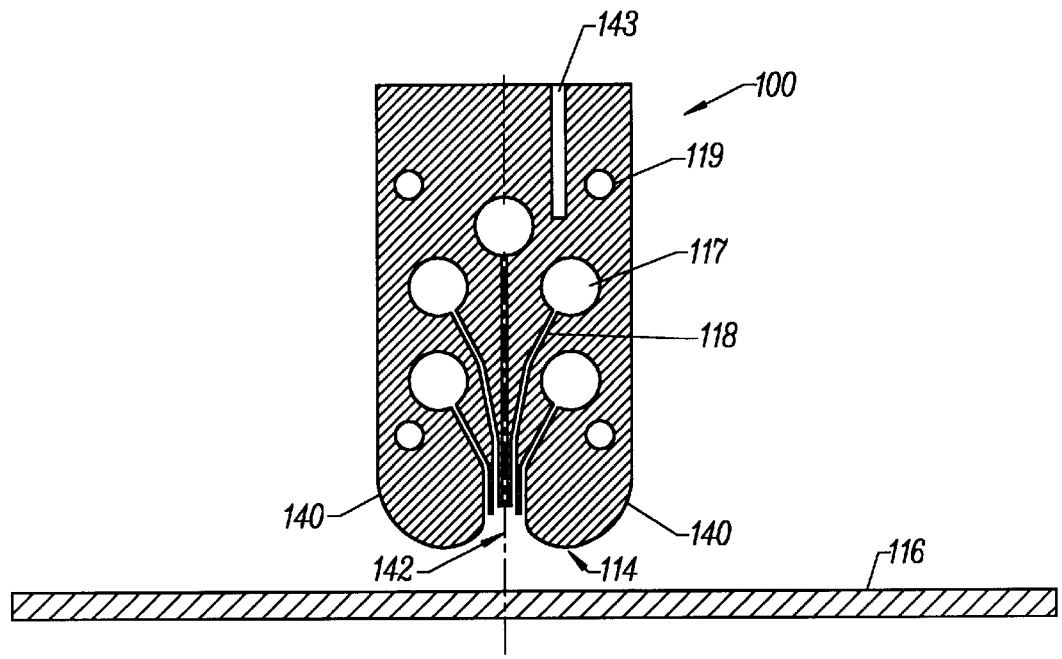
FIGS. 15a and 15b are cross-sectional views of an injector in accordance with a yet another embodiment of the present invention which includes a gas delivery surface having rounded side regions and a center recessed region.

An alternative embodiment of the present invention is now illustrated in FIGS. 15a though 15b. The injector 100 includes at least one elongated passage 117 and distribution slot 118 as described above, however in this case, the gas delivery surface 114 is different. Gas delivery surface 114 generally includes at least one, and preferably two, rounded side regions 140; and a center recessed region 142. Preferably, the distribution slots 118 extend from the each of their respective elongated passages 117 to the center recessed region 142 of the gas delivery surface 114. Gases flow into the passages 117 and through the distribution slots 118 where they are delivered to the center recessed portion 142 of the gas delivery surface 114 along the length of the injector 100. The gases are distributed in a substantially controlled manner along the gas delivery surface where they react and form a layer of material on the surface of the substrate 116 placed beneath the gas delivery surface 114. For temperature control of the injector, elongated passage 119 for receiving a cooling medium may be provided, and thermocouple well 143 formed in the injector 100 can be used to measure the temperature.

Figure 15B:
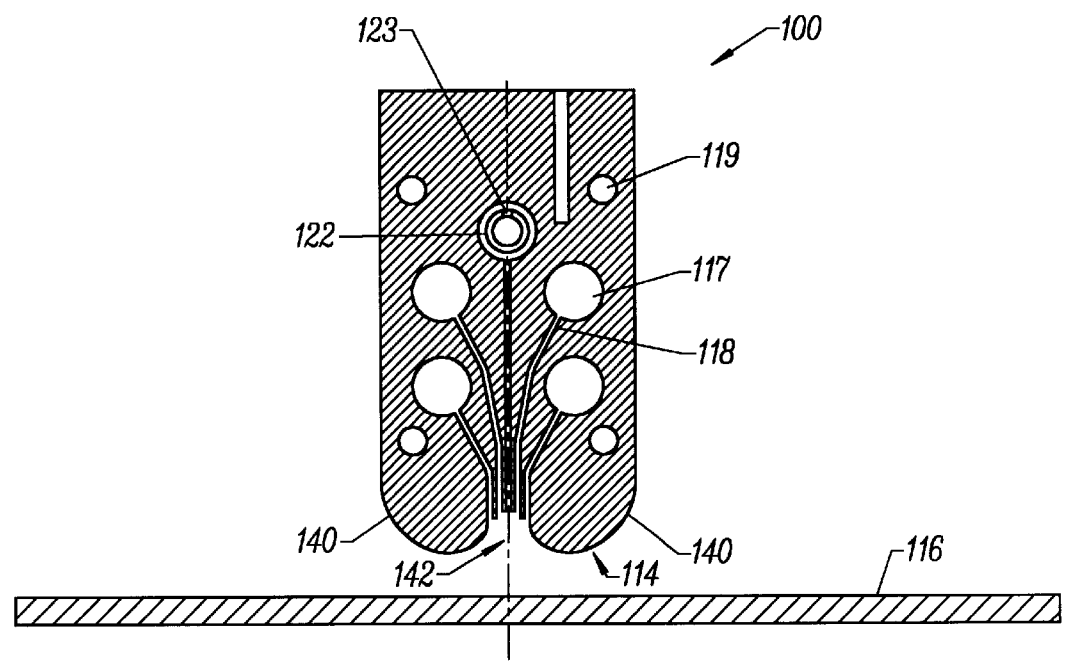

In FIG. 15b, a metering tube 22, is inserted into at least one of the elongated passages 117 and extending between the end surfaces 115. The metering tube 22 is spaced from the walls of the passage 117, and contains opening 123 which is directed away from the distribution slot 118. As described above, the opening 123 may be comprised of various patterns as shown in FIGS. 6 through 11. In a variation of this embodiment, a separate metering tube 22 may be inserted into each of the plurality of first elongated passages 17 provided. A chemical delivery line (not shown) is attached to each metering tube 22 for introduction of the gases.

Figure 15C:
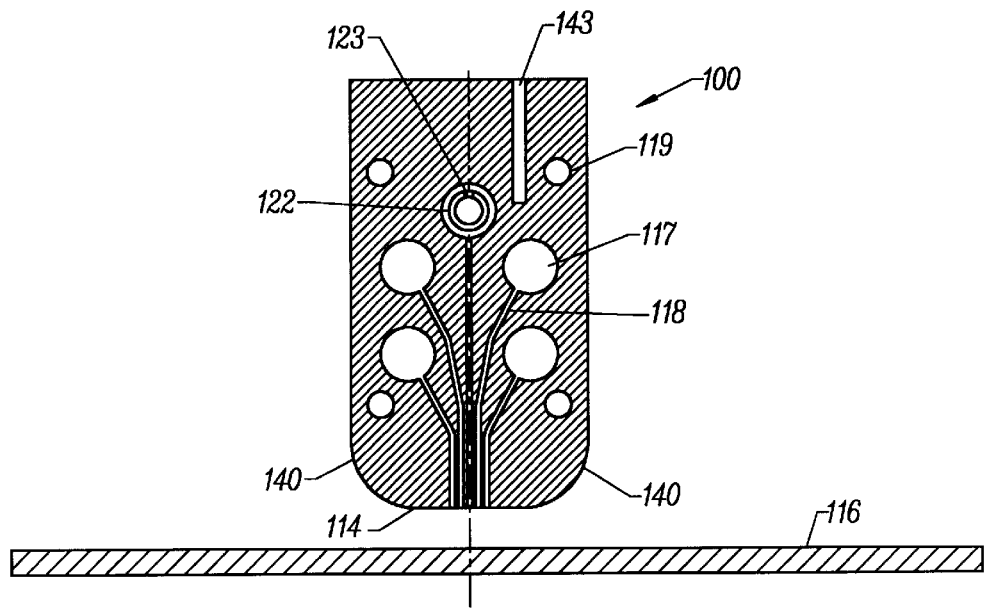
FIG. 15c is a cross-sectional view of an injector in accordance with yet another embodiment of the present invention which includes a gas delivery surface having rounded side regions and a center recessed region.

FIG. 15c shows another variation of the alternative embodiment. As shown, the gas delivery surface 114 includes only the rounded side regions 140. The remainder of the gas delivery surface 114 is substantially planar, and not recessed as in FIGS. 15 a and 15b.

Figure 16A:
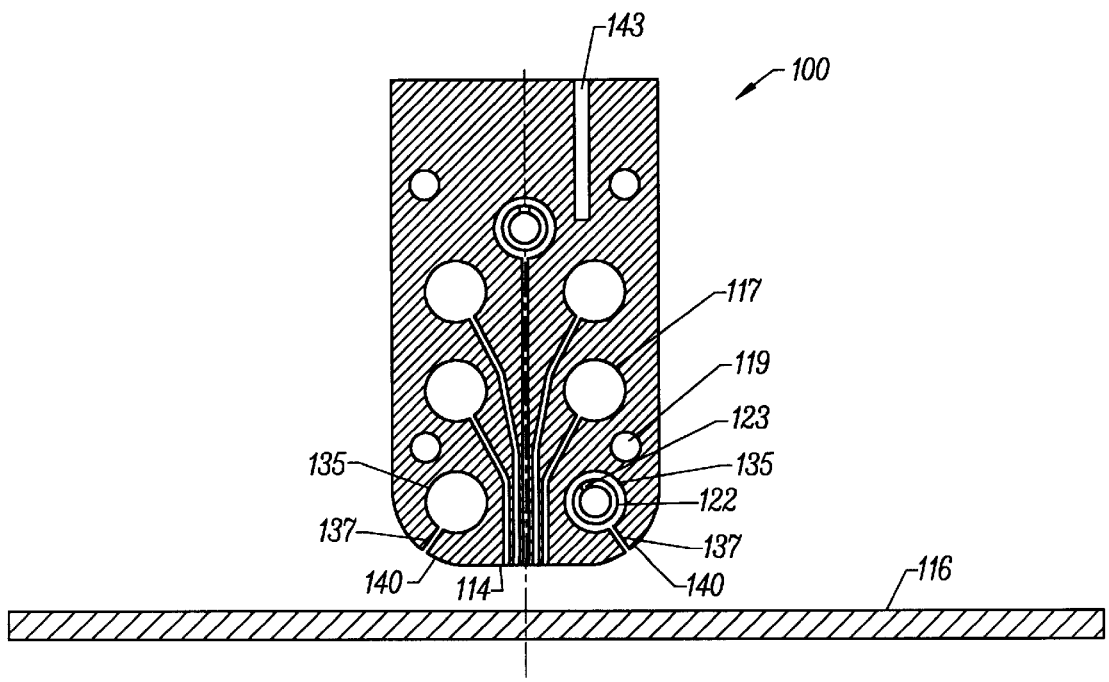
FIGS. 16a and 16b are cross-sectional views of an injector in accordance with another embodiment of the injector shown in FIGS. 15a and 15b, and 15c, which includes passages form delivering an etchant species.

Another alternative of the invention is shown in FIG. 16a. As illustrated, the injector 100 includes a plurality of first elongated passages 117 to receive a plurality of gases. The plurality of first elongated passages 117 each extend between the end surfaces 115, and a chemical delivery line (not shown) is attached to each passage 117 for separate conveyance of the gases. A plurality of distribution channels 118 are formed in the injector 100 and are spaced apart from one another. Each distribution channel 118 extends between a separate first elongated passage 117 and the gas delivery surface 114. Gas delivery surface 114 contains two rounded side regions 140, with the remainder of the gas surface 114 being substantially planar. Gases enter the passages 117 and are conveyed though the distribution channels 18 to the gas delivery surface 114, where such gases mix uniformly along the length and provide a film or layer upon the substrate 116.

To provide for removal of deposits on the surfaces of the injector 100, second elongated passages 135 for receiving an etchant species are also formed within the injector 100, and extend between the end surfaces 115. Distribution slots 137 are formed in the injector and extend between the second elongated passage 135 and the rounded side region of the gas delivery surface 114. In the exemplary illustration, the distribution slot 137 intersects the gas delivery surface 114 right at the beginning of the rounded side region 140, and at an angle to the to normal plane of the injector 100. The angle may vary depending upon the desired delivery point of the etchant species. This configuration promotes distribution of the etchant species towards the sides of the injector where deposits are generally most abundant. Alternatively, the distribution slot 137 may intersect the planar portion of the gas delivery surface.

Figure 16B:
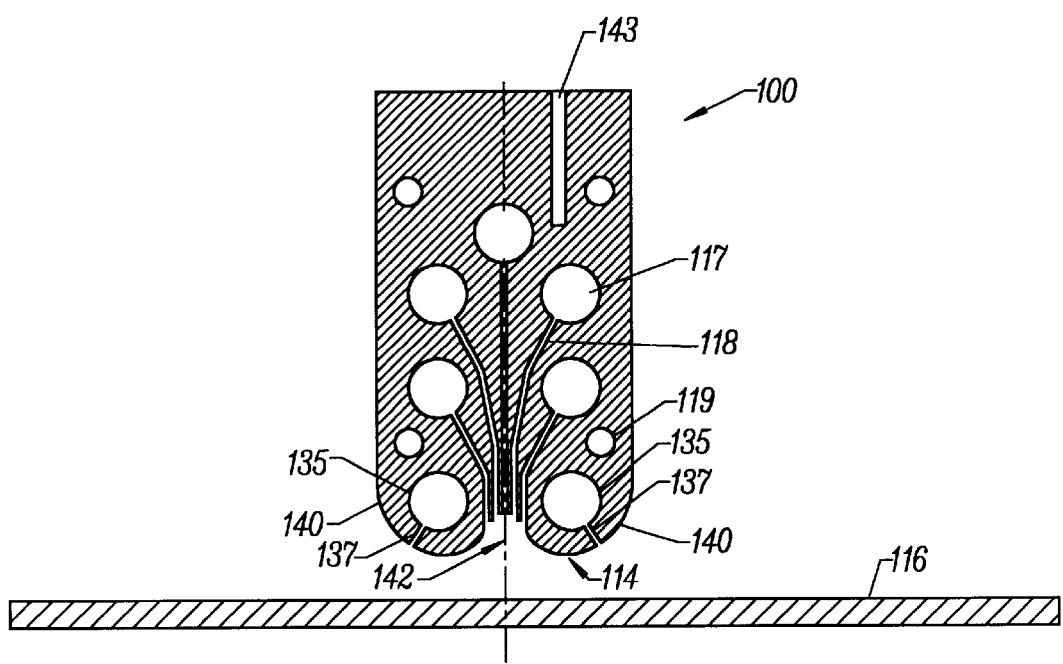

A variation of this embodiment is shown in FIG. 16b, which is the preferred embodiment. Here the gas delivery surface 114 contains two rounded side regions 140 and a center recessed region 142. The plurality of distribution slots 118 extend between each of their respective first elongated passages 117 and the center recessed region 142. To provide the etchant species, second elongated passages 135 are also formed within the injector 100, and extend between the end surfaces 115. Distribution slots 137 are formed in the injector and preferably extend between the second elongated passage 135 and the rounded side region of the gas delivery surface 114. Another advantage of the present invention provides for the metering of the etchant species thereby allowing control of the distribution of the etchant species to the external surfaces. To meter the etchant species, a metering tube 22, is inserted into at least one of the second elongated passages 135 and extending between the end surfaces 115. The metering tube 22 is spaced from the walls of the passage 135, and contains opening 123 which is directed away from the distribution slot 137. As described above, the opening 123 may be comprised of various patterns as shown in FIGS. 6 through 11. In a variation of this embodiment, a separate metering tube 22 may be inserted into each of a plurality of second elongated passages 135 provided. A chemical delivery line (not shown) is attached to each metering tube 22 for introduction of the etchant species.

As should be understood by one skilled in the art from the foregoing description, a variety of embodiments may be realized from the teaching of the present invention. For example, the injector may employ rounded side regions with or without the center recessed region, the use of metering tubes or not, the use of metering tubes in the etchant species passages or not, and the use of the etchant passages or not, and any combination of the above.

NEW EMBODIMENT

Figure 17:
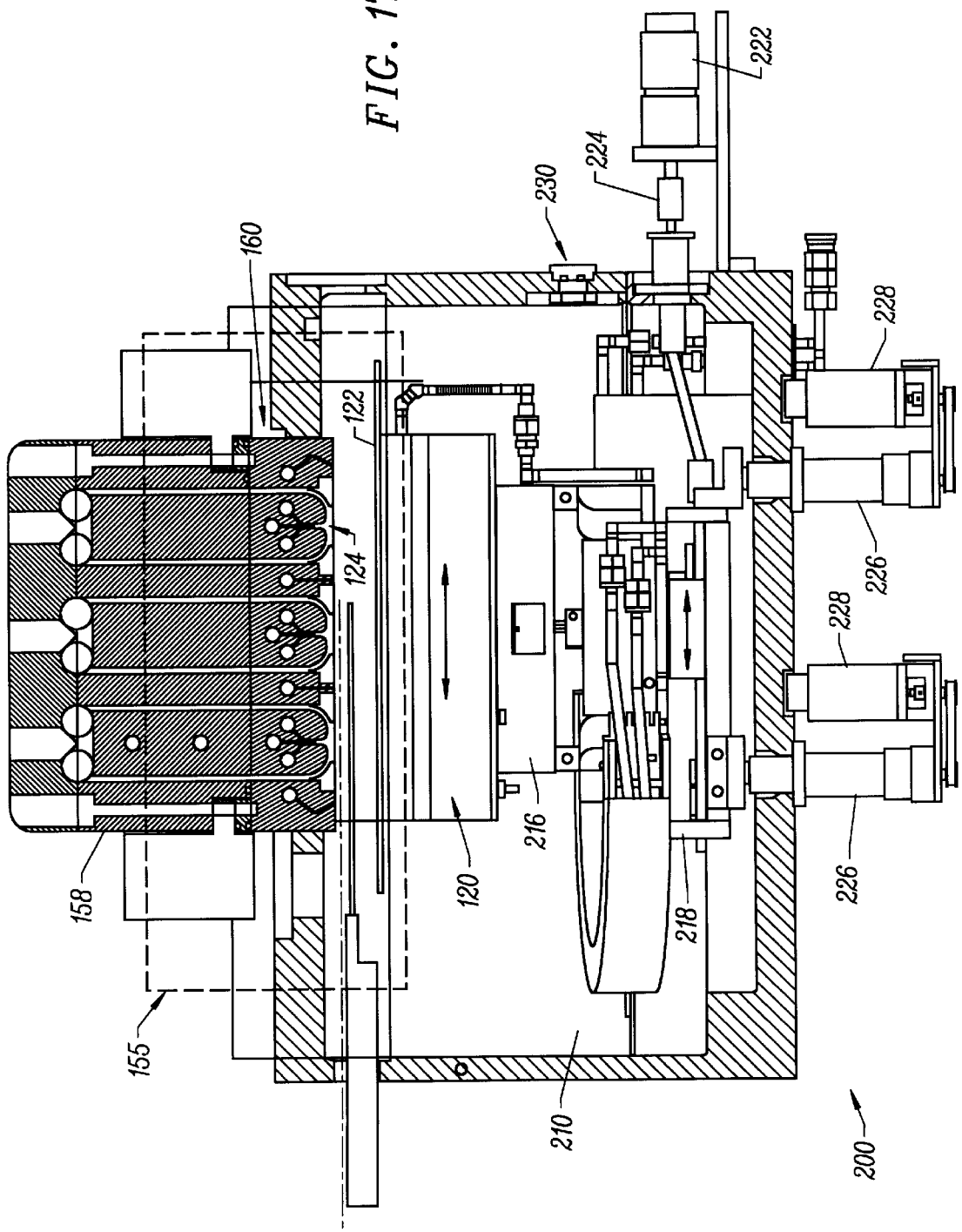
FIG. 17 is a cross-sectional view of a chemical vapor deposition apparatus in accordance with one embodiment of the present invention.
Figure 18:
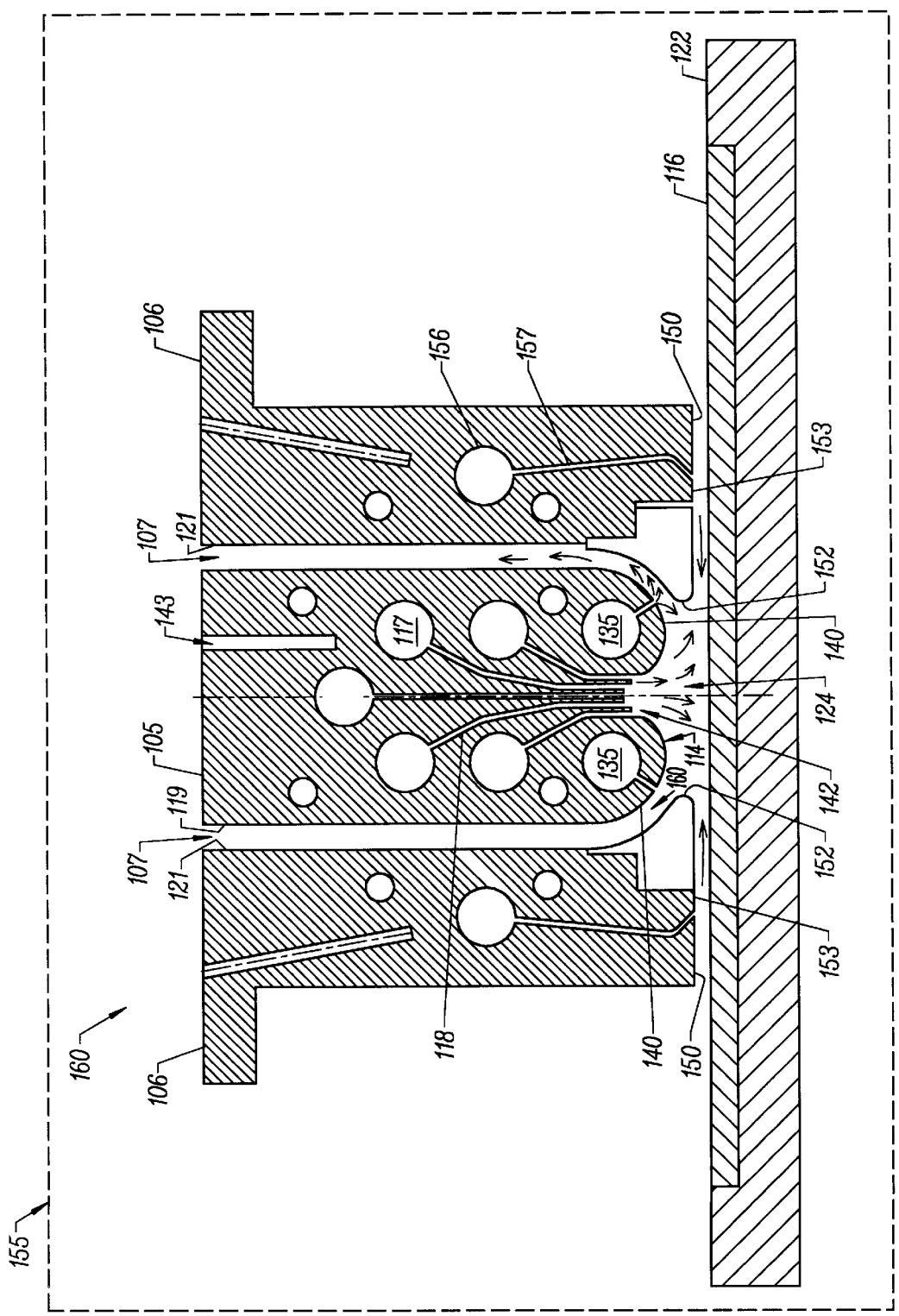
FIG. 18 is an enlarged cross-sectional view of a deposition chamber having an integrated injector comprised of a single body injector and two vent blocks in accordance with an alternative embodiment of the present invention.
Figure 19:
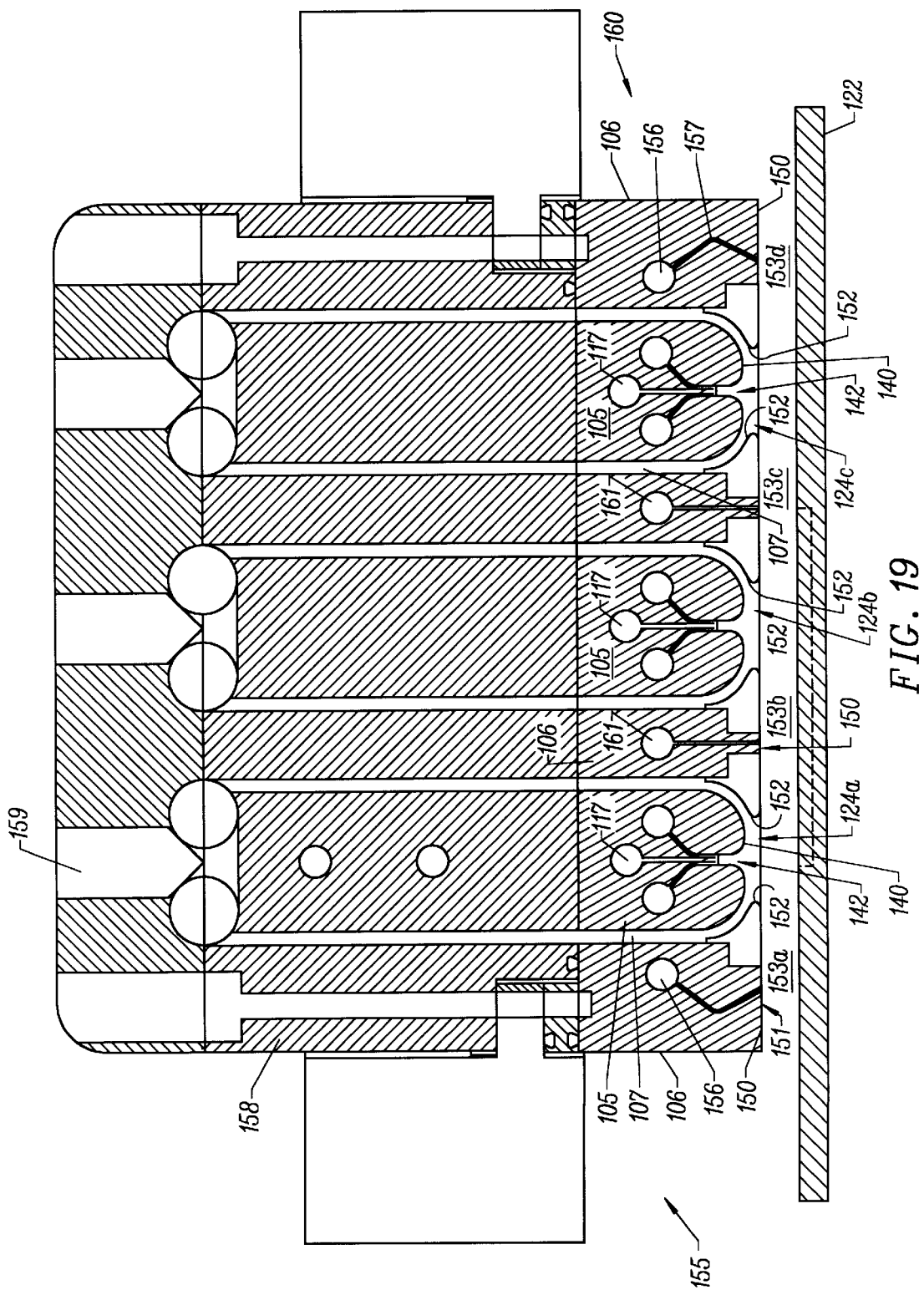
FIG. 19 is an enlarged cross-sectional view of a deposition chamber having multiple injectors and vent blocks in accordance with another embodiment of the present invention.

Of particular advantage, the present invention next provides for an improved deposition chamber having an integrated signal body injector. Referring to FIGS. 17, 18 and 19, the deposition chamber 155 having an integrated injector assembly 160 is depicted. The deposition chamber 155 is typically part of a larger chemical vapor deposition (CVD) apparatus 200 as shown in FIG. 17. FIG. 17 shows one type of CVD apparatus 200 comprised of a single wafer reciprocating apparatus which is fully described in co-pending U.S. patent application Ser. No. 09/113,730, which is filed simultaneously herewith and is incorporated herein by reference. While one example of a CVD apparatus is shown and described, it is to be understood by those of ordinary skill in the art that other types of CVD apparatus may be employed with the present invention. For example, the injector and deposition chamber may be used in a conveyorized CVD apparatus as known in the art or with atmospheric and subatmospheric type reactors.

Turning again to FIG. 17, a CVD apparatus 200 is shown which includes a main chamber 210 which supports the deposition chamber 155 having an injector assembly 160 for injecting reactive (and sometimes inert) gaseous chemicals into deposition regions within the deposition chamber 155. The injector assembly 160 is comprised of one or more individual injectors or applicators. In FIG. 17, the injector assembly 160 has three injectors 105 forming three deposition regions 124, however the injector assembly 160 may form one or any number of deposition regions. Each deposition region 124 is defined by an injector 105 and the wafer or substrate surface 116 as will be described in detail below. The wafer or substrate 116 is placed on a support 122 that is then supported by a chuck 120. The wafer is passed underneath the injector to deposit film across the wafer surface. Preferably, the support 122 is a "seal plate" which holds the wafer 116 in a recess formed in the seal plate. The top surface of the wafer is coplanar with the top surface of the seal plate, but the seal plate is bigger than the wafer 116.

The support 122 is retained on the chuck 120 by applying a vacuum through openings in the chuck to the underside of the wafer to hold the wafer in place. The chuck 120 is supported on a chuck support assembly or platform 216 mounted on a drive assembly 218 supported in the main chamber 210. The platform 216 is guided for linear movement by rails. Preferably the platform 216 is water cooled to protect sensors and the like, and to minimize thermal expansion. The platform 216 is moved by a lead screw driven by motor 222 by a drive train 224 which extends through a vacuum seal. The chuck 120 and drive assembly 218 are supported on leveling screws 226 which extend through the lower wall of the chamber and engage bearings. The leveling screws 226 are driven by motors 228 to raise, lower and level the chuck. The main chamber 210 has at least one gas inlet line 230 for the conveyance of gases, preferably inert gases, to the main chamber 210. This gas inlet line 230 can be used to create an inwardly flowing gas into the deposition chamber 155 which acts as an "inwardly flowing purge". Under appropriate conditions as described below this purge will confine the reactive gases within a deposition region, thus avoiding undesirable deposition of dust in the main chamber and attack on the main chamber components by the reactive gases. The exhaust for the main chamber 210 is through the injector assembly 160 as will be described in detail below. An exhaust manifold 158 is attached to the injector via screws through wells.

The deposition chamber 155 is shown in further detail in FIG. 18. In general, the deposition chamber 155 includes an injector assembly 160 and a support, which in this case is chuck 120, supporting a substrate 116. For clarity the exhaust manifold 158 is omitted. Preferably, the injector assembly 160 is made from a single block of material in which one or more injectors 105 and vent blocks 106 are formed. The vent blocks 106 are positioned adjacent and spaced from each side of the injector 105 to define two exhaust channels 107 therebetween. A deposition region 124 is formed between a gas delivery surface 114 of the injector 105 and the substrate 116. In general the deposition region 124 is elongated and rectangular in shape.

More particularly, the injector 105 is of a single member and is fabricated with a smoothly curved gas delivery surface 114. In an exemplary embodiment, the gas delivery surface 114 includes two rounded side regions 140 and a center recessed region 142. Preferably, the injector 105 is as described earlier as injector 100 in FIG. 16b. The exact dimensions of the curved gas delivery surface 114 may be obtained by employing computational fluid dynamical (CFD) techniques known in the art, or by using scale models. Preferably, such techniques will be used in part to obtain dimensions that miniminize recirculation of the gas flows within the deposition chamber. This will control the average residence time of reactive gases. The vent block 106 is comprised of a single member with a front and back (i.e. side surfaces, one side surface is shown as reference numeral 121), a top and end surfaces, and a bottom external surface 150.

Of particular advantage, the gas delivery surface 114 of each injector 105 is employed as the upper portion of the deposition chamber 155. The lower portion of the deposition chamber 155 is formed by the support 122 and/or the substrate 116 placed on the support 122. The deposition region 124 is formed between the gas delivery surface 114 and the substrate 116 and support 122.

To remove reaction products, exhaust channels 107 are employed. The gas delivery surface 114 and the vertical sides 119 of the injector 105 form the inner surface of exhaust channels 107. The outer surface defining the exhaust channels 107 is formed by one side surface 121 of the vent blocks 106. The side surfaces 121 of the vent blocks 106 are spaced apart and facing the injector 105, and are shaped so as to minimize undesirable stagnation or separation of gases flowing through the exhaust channels 107. Specifically, the side surface 121 of the vent block contains a contoured region 152, or nose, which is generally positioned adjacent and spaced from the rounded surface 140 of the gas delivery surface 114. This contoured region 152 may be fabricated from a separate "contour " or nose insert which attaches to the vent block 106, or may be formed as an integral part of the vent block 106.

Preferably, the present invention provides for the formation of a "semi-seal" region 153 which acts to isolate each of the deposition regions. In particular, the external surface 150 of the vent blocks 106 are placed in close proximity to the flat surface of the substrate 116 so as to form the semi-seal region 153. The semi-seal region 153 is an area with a height described below and a length that generally extends along a portion of the external surface 150. In conjunction with the inwardly flowing purge from gases supplied to the surrounding main chamber 210 via inlet 230, this semi-seal region 153 has been found to be effective in containing the reactive gases within the deposition region 124. This feature is also aids in minimizing formation of powder and particulate contamination elsewhere within the deposition chamber 155. More specifically, the inwardly flowing purge is created by injecting gas into the main chamber 210 via gas inlet 230 and providing the exhaust for the system to be through the exhaust channels 107 in the deposition chamber 155. This creates a flow of gas towards the deposition chamber 155 and into the injector assembly 160 (hence the word "inwardly"), thereby acting as an inwardly flowing purge which helps to isolate the deposition regions. To provide the semi-seal region 153, the spacing between the surface 150 and the substrate 116, and purge flowrate of from the main chamber (i.e. the gas flowrate of gases injected into the main chamber 210 via gas inlet 230) are considered. Preferably, the purge flowrate is selected so as to ensure a purge velocity "$v_{purge}$" which is small compared to the flowrate of the gases 142 conveyed by the injector 105, but large enough that the characteristic diffusion length of the reactive gases is smaller than the length of the semi-seal region 153. As shown in the FIG. 18, the semi-seal region 153 is created in the region where the external surface 150 and the surface of the substrate 116 are closely adjacent and parallel, i.e. form the outer edge of the external surface 150 to the rounded edge of the contoured region 152 in this implementation. The diffusion length "$L_{diff}$" is given by:

$$L_{diff} = D_{ab} / v_{purge}$$

where $D_{ab}$ is the effective binary diffusion coefficient of the reactive gases in the ambient gases.

Applying the above equation in an example: for a binary diffusion coefficient of 0.2 cm²/sec, and a purge velocity of 1 cm/second, the diffusion length would be 2 mm. Thus, a semi-seal region having a length greater than the diffusion length will reduce the concentration of reactive gases escaping from the deposition region 124. Accordingly, in this example the length of the semi-seal region 153 should be selected to be greater than 2 mm, for example a length of 1.0 to 1.5 cm would be appropriate.

The inventors have found that for a minimum distance between the top surface of the wafer or substrate 116 and the closest portion of gas delivery surface 114 (i.e. the lowest part of the gas delivery surface, the part closest to the substrate) of 5 to 6 mm; a depth of the injector ( i.e. perpendicular to the figure plane) of roughly 22–25 cm; and total gas flows 142 from the injector 105 of 10–20 standard liters per minute (slpm); then the semi-seal spacing "h" is equal to or less than 1.0 mm, and is preferably in the range of approximately 0.5 to 1.0 mm. The semi-seal spacing "h" is the distance from the top surface of the substrate 116 to the external surface 150 of the vent block 106. In addition the inwardly directed purge flows of gases from the main chamber 210 are preferably in the range of approximately 2 to 4 slpm. In particular, the inventors have found that if the semi-seal spacing "h" is 3 mm or greater, the seal is rendered ineffective in confining the reactive gases to the deposition region 124. In contrast, use of the preferred spacing results in: no detectable leakage of reactive gases into the outer regions of the deposition chamber ( i.e. beyond the edges of vent blocks 106), minimal disturbance of the deposition reaction by the purge gas flows, and good control of the extent of deposition on the substrate 116. The extent of deposition refers to the area of the deposition region 124, and specifically refers to the degree to which the deposition reaction extends past the contour edge 152 and into the semi-seal region 153. It is important that the edge of the deposition region 124 be well controlled and reproducible to ensure good uniformity and reproducibility of the film deposited on the substrate 116. If the deposition extends well into the semi seal region 153, dust will also be deposited on the semi seal surfaces 150 and thus give rise to particles and the need for cleaning. Thus, it is useful to select purge gas flows and the height of the semi seal region 153 which cause the deposition region 124 to be only as wide as the separation between the edges of the two opposite contours 152.

During deposition, dust or films from by-products of the reactive gases may form on the exposed surfaces of the deposition chamber 155. The inventors have found that controlling the temperature of these surfaces using cooling passages 119 filled with flowing coolant (such as purified water) assists greatly in minimizing the amount of deposition occurring on such surfaces. It is well known that the vapor etching of silicon dioxide proceeds most readily at temperatures less than 80 to 100° C.; thus, cleaning is most effective if the gas delivery surfaces 114 and the contour surfaces 152 are kept cool using the passages 119.

To further assist in the removal of deposits, the present invention employs etching passages. In the exemplary embodiment, etching passages 135 and 156 are shown in the injector 105 and the vent blocks 106, respectively. Etching passages 135 and 156 and accompanying distribution slots 157 and 140, make it possible to dispense etchant gases, such as hydrous or anhydrous HF vapor (in the case of silicon dioxide deposition), which assist in the removal of the deposited by-products without the necessity of disassembly and mechanical cleaning of the deposition chamber 155 and injector assembly 160. One may choose to use only the etching passages 156 and slots 157, or even to employ the gas passages 117 and slots 118, for this purpose.

More specifically, at least one etching passage 135 is formed in the injector 105 and extends between the ends. At least one etching distribution slot 137 is formed in the injector 105 and extends between the etching passage 135 and the gas delivery surface 114. The etching distribution slot 137 may exit the gas delivery surface 114 at the rounded side region 140. The etching distribution slot 137 may intersect the gas delivery surface 114 at various angles depending upon the desired direction of the flow of the etchant species. In other words, the orientation of the etching distribution slot 137 may be varied to direct the etchant species to certain surfaces on the injector 105 and deposition chamber 155.

Preferably, the vent blocks 106 also employ at least one etching passage 156 and etching distribution slot 157 for conveying an etchant species. The at least one passage 156 is formed in the vent block 106 and extends between its ends. At least one etching distribution slot 157 is formed within the vent block 106 and extends between the passage 156 and the external surface 150 of the vent block. The etching distribution slots 157 may exit the external surface 150 at the planar region, and intersect the surface at an angle such that the etchant species is directed toward the semi-seal region 153. Alternatively, the etching distribution slot 157 may extend to the contoured region 152. In another variation, the etching distribution slot 157 is positioned to exit the external surface 150 in a perpendicular manner.

In order to increase the throughput of the CVD system, a deposition chamber having an injector assembly 160 with multiple injectors 105 and corresponding multiple deposition regions 124a, 124b and 124c may be incorporated into a single large deposition chamber 155, as shown in FIG. 19. In this embodiment, the injector assembly having multiple injectors is also called a multihead injector assembly. Preferably, the deposition chamber is made from one block of material with end caps (not shown) to seal the deposition chamber 155. Alternatively, the deposition chamber 155 can be formed of separate pieces which are attached together. Here multiple sets of injectors 105 and vent blocks 106 (three injectors and four vent blocks are shown) are placed in close proximity to each other thereby forming multiple exhaust channels 107. This exemplary arrangement forms three deposition regions 124a, 124b and 124c. Two of the deposition regions 124 *a* and 124 *c* are characterized as outer regions, and the deposition region in the center 124*b* is characterized as an inner region. Accordingly, the surfaces and other features of the injectors will likewise be characterized as inner and outer consistent with the name of their corresponding deposition region. In this case, the outer external surfaces 150 (i.e. the outer external surfaces of the two outer deposition regions) form the semi-seal to the main chamber 210. To remove the exhaust, an exhaust manifold 158 with exhaust outlet lines 159 is mounted to the top of the plurality of injector and vent blocks 105 and 106. As shown in this exemplary illustration, the passages 135 for receiving an etchant species are omitted from the injector 105. As shown in the exemplary embodiment, the deposition chamber 210 is comprised of an injector assembly 160 and a wafer support 122, wherein the injector assembly contains three injectors 105, and four vent blocks 106. It should be understood, however, by those of skill in the art that other numbers may be used as well as any of the injector and vent embodiments described above.

When depositing a film on the surface of a substrate 116, it is desirable to deposit a uniform film. The support 122 assists in this effort. Specifically, the support 122 is preferably a seal plate with the substrate being carried in a recessed portion of the seal plate such that the top surfaces of the substrate and the seal plate are coplanar. Thus, the seal plate is an extension of the substrate surface 116, and this provides a flat surface that along with the external surface 150, acts to form the semi-seal region 153. Further, the seal plate allows the injectors 105 to extend past the edge of the substrate which promotes uniform coating at the edge of the substrate. The seal plate type of support 122 is used when the substrate 116 to be coated in round. However, if the substrate is rectangular then the seal plate type support would necessarily be used.

When a plurality of injectors 105 are used, in order to obtain substantially identical performance from all the injectors 105, the inventors have found that it is necessary to include internal slots 161 between injectors 105 so that gases, preferably inert gases, may be dispensed in between injectors thereby creating a "slot purge" to provide substantially the same gas inflow at the internal edges of the injectors 105 as created by the chamber purge at the outside edges of the injectors 105 and "outer" semi-seal regions 153*a* and 153*d*. The gas flow of the "slot purge" is adjusted to give substantially identical deposition thickness and extent between the various injectors. This an "internal" semi-seal region 153*b* and 153*c* which isolates the internal injector. Again, the deposition extent refers to the area of the deposition region, and specifically refers to the degree to which the deposition reaction extends past the contour edge 152 and into the semi-seal regions 153. The internal slots 161 may also be used alternately for dispensing cleaning gases as described above to remove byproducts from the surfaces of the injector 105 and vent blocks 106.

And finally, in another embodiment, the metering tubes as described above may be employed in the passages 117 of the injectors 105, as well as in the etching passages 135. Further, the metering tubes may be employed in the etching passages 156 and 161 of the vent blocks 106. The metering tubes are replaceable, thus one can vary the configuration of gas flow desired by simply detaching one metering tube and inserting another metering tube of differing aperture placement or diameter. No disassembly of the injector body is required. Further, modeling or experimentation allows customized metering tubes to be manufactured for particular applications or machines The present invention also provides for a method of making the injector assembly and deposition chamber. Preferably, the deposition chamber 155 is formed in part by using a single block of material and wire EDM processes. The deposition chamber is composed of two main components, the injector assembly and end caps. End caps are attached to the injector assembly, and the end caps also provide a point of attachment for gas delivery manifolds (not shown) that provide gases that are conveyed to the deposition regions via the injectors 105. As described above, the injector assembly 160 consists of a one or multiple injectors 105. For clarity, the injector assembly containing a single injector may be called a single head injector, and the injector assembly containing multiple injector s may be called a multihead injector. The injector assembly, whether it is a single head or multihead is preferably fabricated from a single block of material. Alternatively the injector assembly may be fabricated from separate pieces, however this makes the injector assembly difficult to align and assemble. The block of material is preferably made from stainless steel 304, however many other alloys can be used. To fabricate the injector assembly, the block is first ground to a desired size and then the through holes are drilled through the length of the block to form the elongated passages. Preferably the elongated passages are gun drilled. The block is then stress relieved and machined to final sized dimensions. Next the block is subjected to wire EDM processes to form all of the injector gas delivery slots and contours in the block. The wire EDM process provides several critical features: 1) due to its non contact material removal, extremely thin, high tolerance slots can be cut over the entire length of the block; 2) the surface finish is free of any unwanted metal burrs; and 3) only undetectable stresses are left in the injector block body. The contours of the exhaust channels are cut with the EDM wire, however, the exhaust channels are not cut out completely through at this time. Rather, the pieces are left connected to the block, and the end caps are first attached as described below.

The end caps of the injector assembly house the sealing surfaces for the metering tubes and are the connecting point for all gas delivery manifolds. In fabricating the block which becomes the injector assembly, the end caps are machined to desired shape and size and are then stress relieved. The end caps are then brazed on each end of the injector assembly. The second important fabrication process to the manufacture of the injector assembly is bonding the end caps to the injector assembly. Preferably, the end caps are brazed on using a nickel braze alloy, and provide a bond which: 1) creates a hermetic seal between injector gas passages; 2) creates a machinable interface which can be utilized as a sealing surface; and 3) provides a corrosion resistant, porous free bond equal to or better than the stainless steel parent material. This process in essence creates the complete single piece assembly by fusing the three main components, ie. the two end caps and the injector assembly, into one piece.

After the end caps have been brazed to the injector assembly, final machining takes place to ensure all sealing surface are flat and have the proper surface finish. This final machining step includes removing the material left in the exhaust channels. The contour of the exhaust channels were formed earlier in the wire EDM step, and now the material is removed thereby leaving the open, contoured exhaust channels. At this point the injector assembly is one homogeneous block, completely leak tight.

The gas delivery manifolds should evenly distribute gases to the multihead injector assembly. For example, a gas delivery manifold may be used where a series of stacked plates are machined to provide equal length gas passages that distribute the source gas in and split it equally to each injector 105. For example, two injectors require four nitrogen inlets. The gas delivery manifold takes one inlet and diverts it equally to four metering tubes. It is critical that each branch formed in the manifold is equal in length to provide uniform distribution to each metering tube. The multiple plates are brazed together in a stack to form a compact manifold. The gas delivery manifold can be sealed to the end caps with metal c-rings The simplicity of the design favors formation of precise components and thus, greater control of gas distribution. The foregoing demonstrates an improved injector and deposition chamber for the processing of substrates in furtherance of the aims, advantages and objects set forth above.

While the invention has been described in connection with specific embodiments, it is evident that many variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed:

1. A deposition chamber for providing gas distribution to a substrate, comprising:
    an injector assembly comprised of at least one single injector formed of a single member and having:
        end surfaces;
        at least one elongated gas delivery surface extending along the length of the member for delivering gases to the substrate;
        at least one of a first elongated passage formed in said injector and extending between the end surfaces for receiving a gas; and
        at least one of a first thin, spaced, elongated distribution slot formed in said injector, extending directly between said one of said first elongated passage and the elongated gas delivery surface for carrying the gas from the respective passage to the gas delivery surface for distribution along the substrate placed adjacent said delivery surface;
    a plurality of vent blocks each having end surfaces and at least one elongated external surface extending along the length of the vent block,
    wherein said vent blocks are positioned adjacent and one on each side of said at least one single injector, and spaced from said injector to define exhaust channels there between for removing the gases; and
    a support for supporting the substrate, said support being positioned beneath said injector and vent blocks and creating a deposition region there between.

2. The deposition chamber of claim 1 wherein the elongated gas delivery surface of said injector member has at least one rounded side region, and wherein one side of each of said vent blocks that is adjacent to said injector member includes at least one contoured side region, such that the exhaust channel formed between said regions is rounded for providing substantially uniform removal of said gases.

3. The deposition chamber of claim 1 wherein said injector further comprises:
    said elongated gas delivery surface having a center recessed region;
    a plurality of said first elongated passages formed in said injector and extending between the end surfaces for receiving a gas; and
    a plurality of said first thin, spaced, elongated distribution slots formed in said injector, one of said plurality of slots extending directly between each of said first elongated passages and the center recessed region of said gas delivery surface for carrying the gases from the respective passage to the gas delivery surface for distribution along the substrate placed adjacent said delivery surface.

4. The deposition chamber of claim 3, further comprising at least one metering tube inserted into the at least one of said plurality of first elongated passages and spaced from the walls of said first elongated passage and extending between the ends, serving to receive the gas and distribute the gas along the first elongated passage where it flows through the distribution slot to the substrate.

5. The deposition chamber of claim 4 wherein said at least one metering tube comprises a porous material.

6. The deposition chamber of claim 4 wherein said at least one metering tube comprises a slot extending along the length of said metering tube, said slot being directed away from the distribution slot.

7. The deposition chamber of claim 4 wherein said at least one metering tube comprises a plurality of openings along the length of said metering tube, and said openings being directed away from the distribution slot.

8. The deposition chamber of claim 1, further comprising at least a second elongated passage formed in said injector and extending between the end surfaces for receiving an etchant species; and
    at least a second thin, spaced, elongated distribution slot formed in said injector and extending directly between the at least a second elongated passage and the gas delivery surface for carrying the etchant species from said second elongated passage for distribution along the elongated gas delivery surface.

9. The deposition chamber of claim 8 further comprising at least a third elongated passage formed in said injector and extending between the ends serving to receive a medium for temperature control of the injector and;
    said elongated gas delivery surface having a center recessed region.

10. The deposition chamber of claim 1 wherein said vent block further comprises:
    at least one elongated passage formed in said vent block and extending between the end surfaces for receiving an etchant species; and
    at least one thin, elongated distribution slot formed in said vent block and extending between the at least one elongated passage and the elongated external surface for carrying the etchant species from said elongated passage for distribution along the elongated external surface.

11. The deposition chamber of claim 1 wherein said deposition chamber further comprises a plurality of injectors and a plurality of vent blocks, each of said vent blocks being positioned adjacent and spaced from each side of said plurality of injectors to form a plurality of exhaust channels therebetween.

12. An deposition chamber for delivering gases to a substrate, comprising:
    an injector assembly having at least one injector comprised of a single member having end surfaces and at least one elongated gas delivery surface extending along the length of the member for delivering gases to the substrate, said gas delivery surface having rounded side regions and a center recessed region; and
    at least two vent blocks, each vent block having end and side surfaces and at least one elongated external surface extending along the length of the vent block, at least one of said side surfaces having a contoured side region, and said vent block being positioned adjacent and spaced from said injector member to define an exhaust channel there between, said exhaust channel having a rounded portion where formed between said rounded and contoured regions for removing said gas in a substantially uniform manner; and a support for supporting and moving a substrate, where said support, and each injector and at least two vent blocks form a deposition region there between for processing said substrate, wherein said injector includes a plurality of first elongated passages formed in said single member and extending between the end surfaces for receiving a gas, and a plurality of first thin, spaced, elongated distribution slots, one of said plurality of slots extending directly between each of said first elongated passages and the center recessed region of said gas delivery surface for carrying the gases directly from the respective passage to the gas delivery surface, and wherein at least one of said vent blocks includes at least one second elongated passage formed in said vent block and extending between the end surfaces for receiving an etchant species, and at least a second thin, elongated distribution slot extending directly between said second elongated passage and the external surface for carrying the etchant species from said elongated passage for distribution along the elongated external surface.

13. The deposition chamber of claim 12, wherein said injector further comprising at least one third elongated passage formed in said single member and extending between the end surfaces for receiving an etchant species; and at least one third thin, elongated distribution slot formed in said single member and extending directly between the at least one third elongated passage and the rounded side region of said gas delivery surface for carrying the etchant species from said elongated passage for distribution along the elongated gas delivery surface.

14. The deposition chamber of claim 12, further comprising at least one metering tube inserted into the at least one first elongated passage and spaced from the walls of said first elongated passage and extending between the ends, serving to receive the gas and distribute the gas along the elongated passage where it flows through the distribution slot to the substrate.

15. The deposition chamber of claim 14 further comprising three injectors and four vent blocks, each of said vent blocks being placed adjacent one side of each of the three injectors such that two of said vent blocks are internal to the chamber, and the other two vent blocks make up the outer part of the chamber; and wherein the two internal vent blocks include an elongated internal passage for distributing gases between the injectors.

* * * * *